United States Patent [19]

Oyama

[11] Patent Number: 5,412,608

[45] Date of Patent: May 2, 1995

[54] METHOD OF ERASING DATA ON NON-VOLATILE SEMI-CONDUCTOR MEMORY

[75] Inventor: Ken-ichi Oyama, Tokyo, Japan

[73] Assignee: NEC Corporation, Tokyo, Japan

[21] Appl. No.: 150,809

[22] Filed: Nov. 12, 1993

[30] Foreign Application Priority Data

Nov. 13, 1992 [JP] Japan .................. 4-303431

[51] Int. Cl.⁶ .............................................. G11C 7/00
[52] U.S. Cl. ............................. 365/218; 365/185; 365/900
[58] Field of Search ................. 365/218, 185, 900

[56] References Cited

U.S. PATENT DOCUMENTS 5,255,237 10/1993 Kodama ................. 365/218
5,295,107 3/1994 Okazawa et al. ........ 365/218

FOREIGN PATENT DOCUMENTS 2-223097 9/1990 Japan ................. 365/218

OTHER PUBLICATIONS

Seiji Yamada et al, "A Self-Convergence Erasing Scheme For a Simple Stacked Gate Flash Eeprom", Sep. 1991 *IEEE*, pp. 11.4.1–11.4.4.

*Primary Examiner*—Joseph A. Popek
*Assistant Examiner*—Tan Nguyen
*Attorney, Agent, or Firm*—Sughrue, Mion, Zinn, Macpeak & Seas

[57] ABSTRACT

In order to suppress dispersion of threshold level voltages upon erasure of a large number of cells constituted from FETs having a floating gate electrode, drain electrode D, source electrode S and substrate Sub of each memory cell, all of the above electrodes are set to 0 V while a pulse of −19 V and a pulse width of 0.01 second is applied to control gate electrode CG to remove electrons accumulated in floating gate electrode FG by an F-N tunnel current. Then, while drain electrode D, source electrode S and substrate Sub are kept set to 0 V, another pulse of 14 V and a pulse width of 0.1 second is applied to control gate electrode CG to effect injection of electrons into floating gate electrode FG by the F-N tunnel current.

7 Claims, 3 Drawing Sheets

METHOD OF ERASING DATA ON NON-VOLATILE SEMI-CONDUCTOR MEMORY

BACKGROUND OF THE INVENTION

1. Field of the Invention

This invention relates to a method of erasing data on a non-volatile semi-conductor memory, and more particularly to a method of erasing data on a non-volatile semi-conductor memory wherein a large number of field effect transistors each having a floating gate electrode are arrayed as memory cells.

2. Description of Related Art

FIG. 1(A) is a circuit diagram of a memory cell of a non-volatile semi-conductor memory wherein a large number of field effect transistors (hereinafter referred to as FETs) each having a floating gate electrode are arrayed as memory cells, and FIG. 1(B) is a sectional view showing the structure of the memory cell.

The memory cell shown in FIGS. 1(A) and 1(B) includes P-type silicon substrate 1, tunnel oxide film 2 formed by using a silicon thermal oxidation technique, a thin film forming technique based on the CVD (chemical vapour deposition) method, a photolithography technique, a thin film dry etching technique or some other suitable technique, floating gate electrode FG of polycrystalline silicon, interlayer insulator film 3, a gate electrode portion of the two polycrystalline silicon layer type, and source electrode S and drain electrode D of a diffused layer formed by using an ion implantation technique of phosphor or arsenic. In the non-volatile memory, electrons are accumulated into floating gate electrode FG through tunnel oxide film 2 to raise the threshold level voltage of the FET memory cell at control gate electrode CG in order to write data, and the electrons are removed from floating gate electrode FG through tunnel oxide film 2 to lower the threshold level voltage in order to erase the data.

In the non-volatile memory described above, it is known that the threshold levels of the memory cells after erasure of data disperse within a range of several volts due to dispersion in film thickness, film quality or working accuracy of tunnel oxide film 2 of the memory cells. As one countermeasure for suppressing dispersion, a method which makes use of injection of hot carriers into the floating gate electrodes arising from the drain avalanche phenomenon is conventionally known (Seiji Yamada, Technical Digest of 1991 International Electron Devices Meeting, pp.307-310).

An outline of the method is described with reference to FIG. 5. FIG. 5 is a diagram showing the relationship of gate current $I_g$ to floating gate voltage $V_{fg^*}$, and control gate voltage $V_{cg}$ when floating gate electrode FG is charged positively.

When the relationship between source-drain voltage $V_{ds}$ and floating gate voltage $V_{fg}$ is $V_{ds} > V_{fg}$, hot carriers generated by the source-drain current are injected into floating gate electrode FG. The types of hot carriers depend upon the floating gate voltage, and are classified, from the low voltage side as, hot holes (in the area of (H.H.) in FIG. 5) originating in a drain avalanche phenomenon, hot electrons (in the area of (H.E.) in FIG. 5) originating from a drain avalanche phenomenon, and channel hot electrons (in the area of (C.H.E.) in FIG. 5). It is important here that, when the floating gate voltage increases to the level indicated by $V_{fg^*}$ in FIG. 5, hot carriers are not injected into floating gate electrode FG any more and the polarity of the carrier charge is reversed. As a result, when, for example, the floating gate voltage is higher than $V_{fg^*}$ and the relationship of $V_{ds} > V_{fg}$ is satisfied, a feedback mechanism in which injection of hot electrons into floating gate electrode FG drops the floating gate voltage and the drop of the floating gate voltage reduces the injection amount of hot electrons is formed between the floating gate voltage and the hot electron injection amount, so that the floating gate voltage converges to $V_{fg^*}$.

Timings of voltage application to the electrodes in order to actually erase data are described with reference to FIG. 6.

First, drain electrode D is set to 0 volt and −13 V is applied to control gate electrode CG while a pulse of 5 V is applied for 0.1 second to source electrode S to remove electrons accumulated in floating gate electrode FG by an F-N (Fowler-Nordhein) tunnel current, and then so-called excessive erasure is performed to accumulate positive holes to charge floating gate electrode to $V_{fg^*} = 2.0$ V or more.

Then, control gate electrode CG is set to 0 V, and a pulse of 5.0 V is applied for 0.5 seconds to source electrode S. As a result of the disposition, the feedback mechanism between the floating gate electrode and the hot electron injection amount described above operates so that the floating gate voltage converges to 2.0 V. As a result, the threshold level of control gate electrode CG after data erasure also converges to a fixed value, which can suppress possible fluctuation of the threshold levels of the memory cells. In fact, the threshold level voltage can be controlled within a range of about 0.7 V depending upon the dispersion of the configuration of source electrode S or some other factor.

With the conventional method of erasing data on a non-volatile semi-conductor memory described above, however, since the drain avalanche phenomenon is used for erasure, there is a problem in that source electrode S and drain electrode D suffer from some damage, resulting in degradation of the voltage-withstanding property of the junction between the diffused layer of the electrodes and the substrate.

Further, in order to make the threshold voltages of the memory cells uniform after an erasure, positive holes are injected into floating gate electrode FG so as to effect excessive erasure upon each erasure. Accordingly, since the injection of positive holes accelerates degradation of tunnel oxide film 2, there is another problem that the switching characteristic between writing and erasure is degraded by the degradation of tunnel oxide film 2.

Furthermore, in order to make the threshold voltages uniform after erasure of data, the source-drain current for causing the drain avalanche phenomenon is required, in addition to electrons to flow into floating gate electrode FG. Accordingly, there is a further problem in that the disposition to make the threshold voltages uniform after erasure of data results in higher power dissipation.

SUMMARY OF THE INVENTION

It is a first object of the present invention to provide a data erasing method which does not depend upon the drain avalanche phenomenon.

It is a second object of the present invention to provide a data erasing method which does not cause degradation of a tunnel oxide film arising from excessive erasure performed for a floating gate upon erasure of data.

It is a third object of the present invention to provide a data erasing method which is low in power dissipation.

In order to attain the objects described above, a method of erasing data on a non-volatile semi-conductor memory is provided according to one aspect of the present invention, the semi-conductor memory comprises a plurality of n-type field effect transistors formed on a semi-conductor substrate, each transistor having a source electrode, a drain electrode, a floating gate electrode and a control gate electrode arrayed as non-volatile memory cells. Assuming that a low threshold voltage state is the erasing state and a high threshold voltage state is the writing state, the method of erasing data comprises the steps of applying, for each of the n-type field effect transistors, a negative first voltage, to the control gate electrode, with respect to the potential at the source electrode and the drain electrode for the first application time so that the threshold level voltage of the field effect transistor which is lowest in speed of data erasing operation by the F-N tunnel current becomes the nearest value of the writing state within a predetermined range in the data erasing state, and applying, to each of the n-type field effect transistors, a positive second voltage, to the control gate electrode, with respect to the potential at the source electrode and the drain electrode for the second application time so that the threshold level voltage of the field effect transistor which is highest in speed of data writing operation by the F-N tunnel current becomes the nearest value of the writing state within the range of the data erasing state.

According to another aspect of the present invention, there is provided a method of erasing data on a non-volatile semi-conductor memory of the type wherein a plurality of n-type field effect transistors formed on a semi-conductor substrate, each transistor having a source electrode, a drain electrode, a floating gate electrode and a control gate electrode arrayed as non-volatile memory cells. Assuming that a low threshold voltage state is the writing state and a high threshold voltage state is the erasing state, the method of erasing data comprises the steps of applying, for each of the n-type field effect transistors, a positive first voltage, to the control gate electrodes, with respect to the potential at the source electrode and the drain electrode for a first application time so that the threshold level voltage of the field effect transistor which is lowest in speed of data erasing operation by the F-N tunnel current becomes the nearest value of writing state within a predetermined range of the data erasing state and applying, to each of the n-type field effect transistors, a negative second voltage, to the control gate electrode, with respect to the potential at the source electrode and the drain electrode for a second application time so that the threshold voltage of the field effect transistor which is highest in speed of data writing operation by the F-N tunnel current becomes the nearest value of writing state within the range of the data erasing state.

In particular, the first application time is preferably 0.01 second, the first voltage is 19 volts, the second applicaion time is 0.1 second and the second voltage is 14 volts.

DESCRIPTION OF THE PREFERRED EMBODIMENTS

In the following description, embodiments of the present invention are described with reference to the drawings.

Figure 1A:
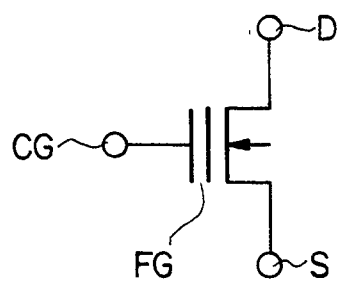
FIGS. 1(A) and 1(B) are a circuit diagram of a memory cell of a non-volatile semi-conductor memory as an object for erasure of data and a sectional view showing the structure of the memory, respectively.
Figure 1B:
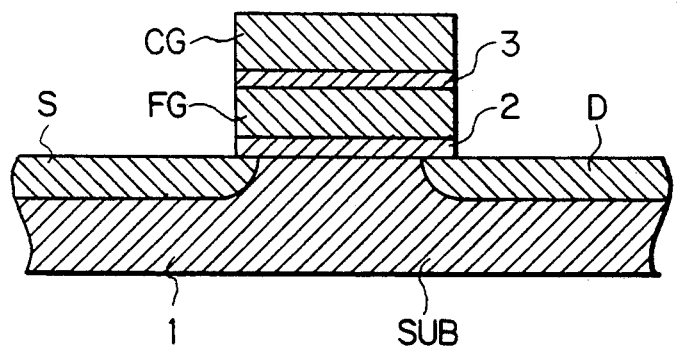
Figure 2A:
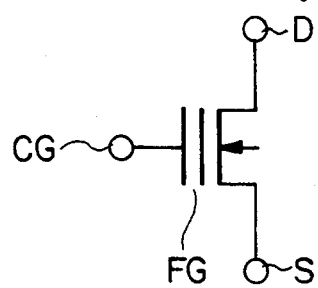
FIGS. 2(A) and 2(B) are a circuit diagram of the memory cell of a first embodiment of the present invention and a timing chart illustrating application of voltages to the electrodes of the memory cell upon erasure of data, respectively.
Figure 2B:
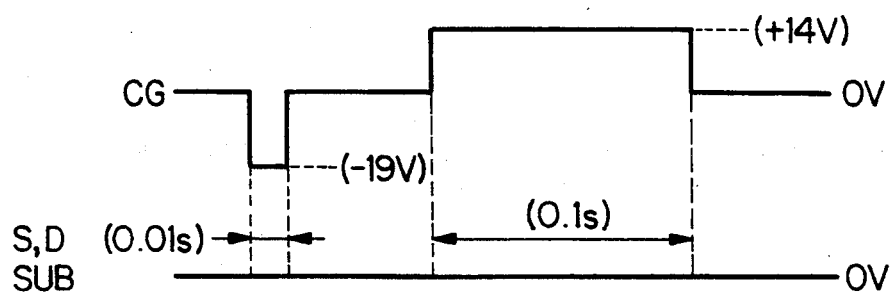

FIGS. 2(A) and 2(B) are a circuit diagram of a memory cell illustrating a first embodiment of the present invention and a timing chart of applying voltages to the electrodes of the memory cell upon erasure of data, respectively. In the following description, the first embodiment is described in accordance with the progress of the disposition upon erasure of data. It is to be noted that the structure of the memory cell is the same as that of the conventional memory cell shown in FIGS. 1(A) and 1(B).

Figure 3:
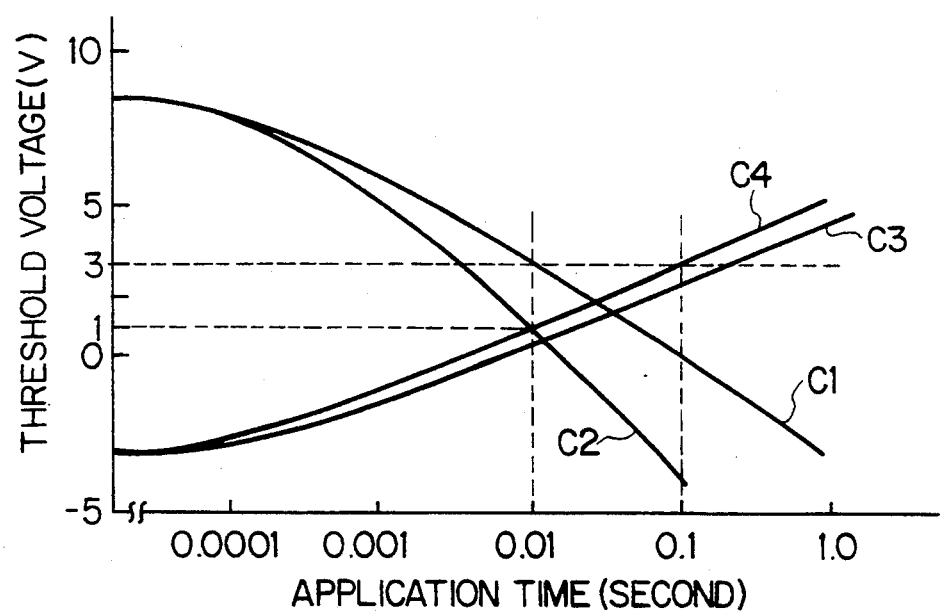
FIG. 3 is a characteristic diagram illustrating variations with respect to time of the memory cell threshold voltage upon erasure of data by the F-N tunnel current and upon injection of electrons into the floating gate.

First, drain electrode D, source electrode S and substrate Sub of each memory cell are set to 0 V while a pulse of −19 V and a pulse width of 0.01 second is applied to control gate electrode CG to remove electrons accumulated in floating gate electrode FG by an F-N tunnel current. The fluctuation with respect to application time of the threshold voltage of the memory cell upon erasure of data by the F-N tunnel current is indicated by curves C1 and C2 in FIG. 3.

All the memory cells are designed as to have the same characteristics. However, actual memory cells typically have different characteristics. Therefore, data erasing operation speed fluctuates in every memory cells. In case of a memory cell having lowest data erasing operation speed, a threshold voltage is lowered as the curve C1. When the application time is equal to 0.01 second, the threshold voltage becomes equal to 3 V which is the upper limit value (value nearest to that in the writing state) within the range of the threshold voltage set for the data erasing condition. Meanwhile, the threshold voltage of another memory cell having highest erasing operation speed is lowered as the curve C2. When the application time is equal to the 0.01 second, the threshold voltage becomes equal to 1 V. As a result, the threshold level voltages fluctuate within the range of 2 V.

It should be noted that in case of the memory cell having highest erasing speed, having the highest F-N tunnel current flowing through tunnel oxide film 2 per unit time, exhibits a higher injection speed than any other memory cell when a positive voltage is applied between the control gate electrode and the substrate to inject electrons into the floating gate electrode. If the threshold voltage is sufficiently low, the variation of the threshold voltage upon injection is raised in accordance with curve C4 in FIG. 3.

Meanwhile, in case of the memory cell having lowest erasing speed, having the lowest F-N tunnel current flowing through tunnel oxide film 2 per unit time, exhibits a lower injection speed than any other memory cell. If the threshold voltage is sufficiently low, the threshold voltage upon injection is raised in accordance with curve C3 in FIG. 3.

Therefore, following erasure of data by the F-N tunnel current described above, while drain electrode D, source electrode S and substrate Sub are kept set to 0 V, a pulse of 14 V and a pulse width of 0.1 second is applied to control gate electrode CG to inject electrons into floating gate electrode FG by the F-N tunnel current. The required condition for the injection is that the threshold voltage of the memory cell having highest injecting operation speed is raised to 3 V which is the upper limit value within the range of data erasing condition. In this instance, the threshold level voltage of the memory cell having highest erasing operation speed becomes equal to 3 V in accordance with curve C4 in FIG. 3. However, the threshold voltage of the memory cell having lowest erasing operation speed is already equal to 3 V, and in this instance, even if a pulse of 14 V and 0.1 second is applied to control gate electrode CG, the threshold level voltage of the memory cell remains equal to 3 V, because injection of electrons into floating gate electrode FG by the F-N tunnel current does not take place unless the pulse width is longer than 0.1 second (refer to curve C3 in FIG. 3). Consequently, the threshold voltages converge approximately to 3 V, and dispersion of the threshold level voltages is suppressed.

Figure 4:
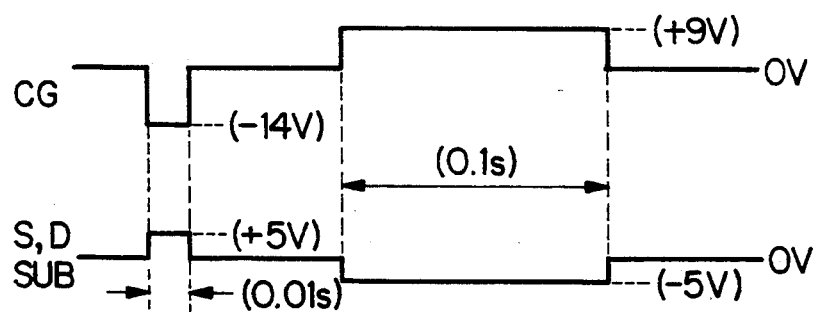
FIG. 4 is a timing chart of application of voltages to the electrodes upon erasure of data of a memory cell of a second embodiment of the present invention.
Figure 5:
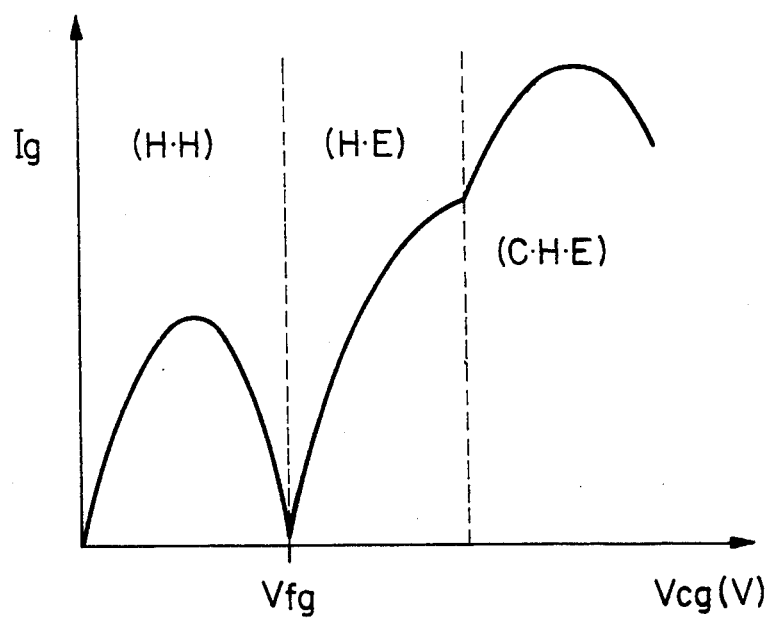
FIG. 5 is a characteristic diagram of the gate current with respect to the floating gate voltage and the control gate voltage of a memory cell according to a method of erasing data on a conventional non-volatile semi-conductor memory.
Figure 6:
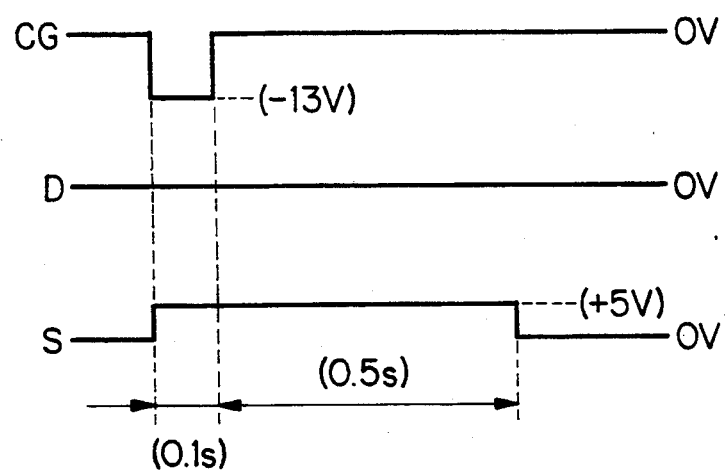
FIG. 6 is a timing chart of application of voltages to the electrodes upon erasure of data of a memory cell of a conventional non-evaporate semiconductor memory.

FIG. 4 is a timing chart of application of voltages to the electrodes upon erasure of data of a memory cell of a second embodiment of the present invention. The second embodiment is described below in accordance with the procedure of the disposition upon erasure of data.

First, drain electrode D, source electrode S and substrate Sub of each memory cell are set to 5 V while a pulse of −14 V and a pulse width of 0.01 second is applied to control gate electrode CG to remove electrons accumulated in floating gate electrode FG by the F-N tunnel current. Following the erasure of data by the F-N current, drain electrode D, source electrode S and substrate Sub are set to −5 V while a pulse of 9 V and a pulse width of 0.1 second is applied to control gate electrode CG to inject electrons into floating gate electrode FG by the F-N tunnel current.

In the present embodiment, the absolute values of the voltages applied to the electrodes are different from those in the first embodiment, but the effective bias voltages between the control gate electrode and the source, drain and substrate electrodes, as well as the effects are exactly the same as those of the first embodiment. However, with the second embodiment, the absolute values of the voltages applied to the electrodes are lower than those in the first embodiment. Therefore, the second embodiment is more advantageous in terms of the voltage withstanding property and the required power supply.

While a P-type silicon substrate is employed as the semi-conductor substrate in the embodiments described above, a different semi-conductor substrate may be employed instead. Further, other voltage values may be employed as the voltage values to be applied to the electrodes if erasure of data and suppression of the dispersion of the threshold voltages by the F-N tunnel current after erasure of data are performed.

As described above, according to the present invention, since it is constructed so that injection of electrons into floating gate electrode 3 using the F-N tunnel current is performed for a predetermined period of time after erasure of data, there is an advantage in that possible dispersion of the threshold level voltages after erasure of data can be suppressed. Further, since only the F-N tunnel current is used in order to control the threshold voltages to a fixed value, there is another advantage in that the voltage withstanding property of the junction between each diffused layer and the substrate is not degraded at all. Further, since the current which is produced when the threshold level voltages are controlled to a fixed value after erasure of data involves only electrons flowing into the floating gate electrode, there is a further advantage in that power dissipation can be reduced.

What is claimed is:

1. A method of erasing data on a non-volatile semiconductor memory on which a plurality of n-type field effect transistors each having a source electrode, a drain electrode, a floating gate electrode and a control gate electrode are arrayed on a semi-conductor substrate as non-volatile memory cells and assuming that a low threshold voltage state is the erasing state and a high threshold voltage state is the writing state, comprising the steps of:

applying, to the control gate electrode of each of the n-type field effect transistors, a first voltage negative to the substrate and the source and drain electrodes, for a first application time so that the threshold voltage of the field effect transistor having lowest data erasing operation speed by an F-N Fowler-Nordheim tunnel current becomes the nearest value of the writing state within a predetermined range in the data erasing state; and applying, to the control gate electrode of each of the n-type field effect transistors, a second voltage positive to the substrate and the source and drain electrodes, for a second application time so that the threshold voltage of the field effect transistor having highest data writing operation speed by the F-N tunnel current becomes the nearest value of the writing state within the range of the data erasing state.

2. A method of erasing data on a non-volatile semiconductor memory as claimed in claim 1, wherein said first application time is 0.01 second, said first voltage is −19 volts relative to the substrate and the source and drain electrodes which are at 0 volts, said second application time is 0.1 second and said second voltage is ±14 volts relative to the substrate and the source and drain electrodes which are at 0 volts.

3. A method of erasing data on a non-volatile semiconductor memory as claimed in claim 1, wherein said first application time is 0.01 second, said first voltage is −14 volts while the substrate and the source and drain electrode are at +5 volts, said second application time is 0.1 second and said second voltage is +9 volts while the substrate and the source and drain electrodes are at −5 volts.

4. A method of erasing data on a non-volatile semiconductor memory on which a plurality of n-type filed effect transistors each having a source electrode, a drain electrode, a floating gate electrode and a control gate electrode are arrayed on a semi-conductor substrate as non-volatile memory cells and assuming that a low threshold voltage state is the writing state and a high threshold voltage state is the erasing state, comprising the steps of:

applying, to the control gate electrode of each of the n-type field effect transistors, a first voltage positive the substrate and the source and drain electrode, for a first application time so that the threshold voltage of the field effect transistor having lowest data erasing operation speed by an F-N tunnel current becomes the nearest value of the writing state within a predetermined range in the data erasing state; and applying, to the control gate electrode of each of the n-type field effect transistors, a second voltage negative to the substrate and the source and drain electrodes, for a second application time so that the threshold level voltage of the field effect transistor which is highest in speed of data writing operation by the F-N tunnel current becomes the nearest value of the writing state within the range of the data erasing state.

5. A method of erasing data on a non-volatile semiconductor memory with a plurality of cells each having a control gate, a floating gate, a tunnel insultion film, a source and a drain area, and data are written by storing electrons in said floating gate through said tunnel insulation film and erased by taking out electrons stored in the floating gate through the tunnel insulation film, wherein said method of erasing data comprising the steps of:

applying a first data erasing voltage to said control gate until a voltage that a threshold voltage of a cell having lowest data erasing operation speed in said non-volatile semiconductor memory becomes highest threshold voltage within the threshold voltages of data erasing state;

applying a second erasing data voltage to said control gate for storing electrons in said floating gate until a voltage that a threshold voltage of a non-volatile memory cell having highest data erasing operation speed becomes highest threshold voltage within the threshold voltages of data erasing state.

6. A method of erasing data on a non-volatile semiconductor memory as claimed in claim 5, wherein said first data erasing voltage to apply to said control gate is negative and said second data erasing voltage to apply to said control gate is positive.

7. A method of erasing data on a n-type non-volatile semiconductor memory with a plurality of cells each having a control gate, a floating gate, a tunnel insulation film, a source and drain area, and data are written by storing electrons in said floating gate through said tunnel insulation film and erased by taking out electrons stored in the floating gate through the tunnel insulation film, wherein said method of erasing data comprising the steps of:

applying a first data erasing voltage to said control gate until a voltage that a threshold voltage of a cell having lowest data erasing operation speed in said non-volatile semiconductor memory becomes highest threshold voltage within the threshold voltages of data erasing state allowing a least Fowler-Nordheim current to pass the tunnel insulation film; and applying a second erasing data voltage to said control gate for storing electrons in said floating gate until a voltage that a threshold voltage of a non-volatile memory cell having highest data erasing operation speed becomes highest threshold voltage within the threshold voltage of data erasing state allowing a greatest Fowler-Nordheim current to pass said tunnel insulation film.

* * * * *